(12) United States Patent  
Barron et al.

(10) Patent No.: US 6,505,811 B1  
(45) Date of Patent: Jan. 14, 2003

(54) HIGH-PRESSURE FLUID CONTROL VALVE ASSEMBLY HAVING A MICROVALVE DEVICE ATTACHED TO FLUID DISTRIBUTING SUBSTRATE

(75) Inventors: Richard J. Barron, Ann Arbor, MI (US); Anil K. Kollipara, Northville, MI (US); Edward Nelson Fuller, Manchester, MI (US)

(73) Assignee: Kelsey-Hayes Company, Livonia, MI (US)

( * ) Notice: Subject to any disclaimer, the term of this patent is extended or adjusted under 35 U.S.C. 154(b) by 0 days.

(21) Appl. No.: 09/604,591

(22) Filed: Jun. 27, 2000

(51) Int. Cl.⁷ .............................................. F16K 31/02
(52) U.S. Cl. .................. 251/129.01; 251/366; 251/367; 251/369
(58) Field of Search ........................... 251/129.01, 366, 251/369, 367; 216/2

(56) References Cited

U.S. PATENT DOCUMENTS

| | | | |
|---|---|---|---|
| 3,031,747 A | 5/1962 | Green | |
| 3,729,807 A | 5/1973 | Fujiwara | |
| 3,860,949 A | 1/1975 | Stoeckert et al. | |
| 4,005,454 A | 1/1977 | Froloff et al. | |
| 4,019,388 A | 4/1977 | Hall, II et al. | |
| 4,023,725 A | 5/1977 | Ivett et al. | |
| 4,152,540 A | 5/1979 | Duncan et al. | |
| 4,181,249 A | 1/1980 | Peterson et al. | |
| 4,341,816 A | 7/1982 | Lauterbach et al. | |
| 4,434,813 A | 3/1984 | Mon | |
| 4,581,624 A | 4/1986 | O'Connor | |
| 4,647,013 A | * 3/1987 | Giachino et al. | ........ 239/102.2 |
| 4,661,835 A | 4/1987 | Gademann et al. | |
| 4,772,935 A | 9/1988 | Lawler et al. | |
| 4,821,997 A | 4/1989 | Zdeblick | |
| 4,824,073 A | 4/1989 | Zdeblick | |

(List continued on next page.)

FOREIGN PATENT DOCUMENTS

| | | |
|---|---|---|
| DE | 2215526 | 10/1973 |
| DE | 2930779 | 2/1980 |
| DE | 3401404 | 7/1985 |
| GB | 2238267 | 5/1991 |

OTHER PUBLICATIONS

IEEE Technical Digest entitled "Compliant Electro–thermal Microactuators", J. Jonsmann, O. Sigmund, S. Bouwstra, Twelfth IEEE International Conference on Micro Electro Mechanical Systems held Jan. 17–21, 1999, Orlando, Florida, pp. 588–593, IEEE Catalog No.: 99CH36291C.

(List continued on next page.)

*Primary Examiner*—Henry C. Yuen
*Assistant Examiner*—David A. Bonderer
(74) *Attorney, Agent, or Firm*—MacMillan, Sobanski & Todd, LLC

(57) ABSTRACT

A fluid control valve assembly including a microvalve for controlling fluid flow in a fluid circuit having a relatively high fluid pressure requirement, such as vehicular brake system, is fixed to an associated fluid distributing substrate with a high-pressure fluid connection. The fluid distributing substrate is provided with fluid passages adapted for connection to a fluid source to provide communication between the fluid source and the microvalve device. The connection between the microvalve and the fluid distributing substrate may include metallic connections forming electrical current paths between the microvalve and the substrate; solder joints forming part of the pressure boundary of the high-pressure fluid connection; underfill formed of elastomeric or other adhesive; and bonding between the substrate and the microvalves in only selected portions of the surface of the microvalve.

18 Claims, 6 Drawing Sheets

U.S. PATENT DOCUMENTS

| | | | |
|---|---|---|---|
| 4,869,282 A | * | 9/1989 | Sittler et al. ............... 137/15 |
| 4,891,120 A | * | 1/1990 | Sethi et al. ............... 204/299 |
| 4,943,032 A | | 7/1990 | Zdeblick |
| 4,959,581 A | | 9/1990 | Dantlgraber |
| 4,966,646 A | | 10/1990 | Zdeblick |
| 5,029,805 A | | 7/1991 | Albarda et al. |
| 5,037,778 A | | 8/1991 | Stark et al. |
| 5,054,522 A | | 10/1991 | Kowanz et al. |
| 5,074,629 A | | 12/1991 | Zdeblick |
| 5,096,643 A | | 3/1992 | Kowanz et al. |
| 5,131,729 A | | 7/1992 | Wetzel |
| 5,133,379 A | | 7/1992 | Jacobsen et al. |
| 5,142,781 A | | 9/1992 | Mettner et al. |
| 5,161,774 A | | 11/1992 | Engelsdorf et al. |
| 5,178,190 A | | 1/1993 | Mettner |
| 5,215,244 A | | 6/1993 | Buchholz et al. |
| 5,216,273 A | | 6/1993 | Doering et al. |
| 5,217,283 A | | 6/1993 | Watanabe |
| 5,238,223 A | | 8/1993 | Mettner et al. |
| 5,267,589 A | | 12/1993 | Watanabe |
| 5,271,431 A | | 12/1993 | Mettner et al. |
| 5,309,943 A | | 5/1994 | Stevenson et al. |
| 5,375,919 A | | 12/1994 | Furuhashi |
| 5,400,824 A | | 3/1995 | Gschwendtner et al. |
| 5,445,185 A | | 8/1995 | Watanabe et al. |
| 5,454,906 A | * | 10/1995 | Baker et al. ............... 216/66 |
| 5,458,405 A | | 10/1995 | Watanabe |
| 5,460,908 A | * | 10/1995 | Reinberg ............... 430/5 |
| 5,553,790 A | | 9/1996 | Findler et al. |
| 5,566,703 A | | 10/1996 | Watanabe et al. |
| 5,909,078 A | | 6/1999 | Wood et al. |
| 5,926,955 A | | 7/1999 | Kober |
| 5,941,608 A | | 8/1999 | Campau et al. |
| 6,019,437 A | | 2/2000 | Barron et al. |
| 6,116,863 A | * | 9/2000 | Ahn et al. ............... 417/332 |
| 6,168,395 B1 | * | 1/2001 | Quenzer et al. ......... 417/413.3 |
| 6,184,065 B1 | * | 2/2001 | Smith et al. ............... 438/117 |
| 6,213,789 B1 | * | 4/2001 | Chua et al. ............... 439/81 |

OTHER PUBLICATIONS

"A Silicon Microvalve For The Proportional Control Of Fluids" by K.R. Williams, N.I. Maluf, E.N. Fuller, R.J. Barron, D.P. Jaeggi, and B.P. van Drieënhuizen, Transducers '99, Proc. $10^{th}$ International Conference on Solid State Sensors and Actuators, held Jun. 7–10, 1999, Sendai, Japan, pp. 18–21.

Mark M. Konarski, "Cure Parameter Effects On The $T_g$ and CTE Of Flip Encapsulants," $43^{rd}$ International SAMPE Symposium and Exhibition. Materials and Process Affordability. Keys to the Future. Held May 31 to Jun. 4, 1998, Anaheim, CA, pp. 823–832 vol. 1. Copyright 1999, IEE.

Jing, Qi, R. Wayne Johnson, Erin Yaeger, Mark Konarski, and Larry Crane, "Flip Chip on Laminate Manufacturability," Proc. SPEI—Int. Soc. Opt. Eng. (USA) 1999 International Conference on High Density Packaging and MCMs. Held Apr. 6–9, 1999, Denver, CO, pp. 345–352. Copyright 2000, IEEE.

Paul N. Houston, Daniel F. Baldwin, Marnico Deladisma, Lawrence N. Crane, and Mark Konarski, Low Cost Flip Chip Processing and Reliability of Fast–Flow, Snap–Cure Underfills, 1999 Proceedings. $49^{th}$ Electronic Components and Technology Conference. Held Jun. 1–4, 1999, San Diego, CA, pp. 61–70. Copyright 2000, IEE.

Carpenter Technology Corporation Technical Data sheet for "Carpenter Low Expansion '42'", dated Nov. 1980.

* cited by examiner

HIGH-PRESSURE FLUID CONTROL VALVE ASSEMBLY HAVING A MICROVALVE DEVICE ATTACHED TO FLUID DISTRIBUTING SUBSTRATE

BACKGROUND OF THE INVENTION

This invention relates in general to fluid control valve assemblies for high-pressure fluid circuits such as vehicle brake systems, and in particular to high-pressure fluid control valve assemblies having a microvalve device attached via a high-pressure fluid connection to a fluid distributing substrate.

MicroElectroMechanical Systems (MEMS) is a class of systems that are physically small, having features with sizes in the micrometer range. These systems have both electrical and mechanical components. The term "micromachining" is commonly understood to mean the production of three-dimensional structures and moving parts of MEMS devices. MEMS originally used modified integrated circuit (computer chip) fabrication techniques (such as chemical etching) and materials (such as silicon semiconductor material) to micromachine these very small mechanical devices. Today there are many more micromachining techniques and materials available. The term "microvalve device" as used in this application means a complete, functioning valve having features with sizes in the micrometer range, and thus is by definition at least partially formed by micromachining. Furthermore, a "microvalve device", as used in this application includes a microvalve, and may include other components such as pressure, temperature, flow or other types of sensors, pumps or other valves of various types. It should be noted that if components other than a microvalve are included in the microvalve device, these other components may be micromachined components or standard sized (larger) components.

Various microvalve devices have been proposed for controlling fluid flow within a fluid circuit. A typical microvalve device includes a displaceable member or valve movably supported by a body. Depending on the type of valve, the valve may be operatively coupled to an actuator for movement between a closed position and a fully open position. When placed in the closed position, the valve blocks or closes a first fluid port that is placed in fluid communication with a second fluid port, thereby preventing fluid from flowing between the fluid ports. When the valve moves from the closed position to the fully open position, fluid is increasingly allowed to flow between the fluid ports.

SUMMARY OF THE INVENTION

The invention relates to a fluid control valve assembly including a microvalve for controlling fluid flow in a fluid circuit having a relatively high fluid pressure requirement, such as vehicular brake system, is fixed to an associated fluid distributing substrate with a high-pressure fluid connection. The fluid distributing substrate is provided with fluid passages adapted for connection to a fluid source to provide communication between the fluid source and the microvalve device. The connection between the microvalve and the fluid distributing substrate may include metallic connections forming electrical current paths between the microvalve and the substrate; solder joints forming part of the pressure boundary of the high-pressure fluid connection; underfill formed of elastomeric or other adhesive; and bonding between the substrate and the microvalves in only selected portions of the surface of the microvalve.

Various other objects and advantages of this invention will become apparent to those skilled in the art from the following detailed description of the preferred embodiments, when read in light of the accompanying drawings.

DETAILED DESCRIPTION OF THE PREFERRED EMBODIMENTS

Figure 1:
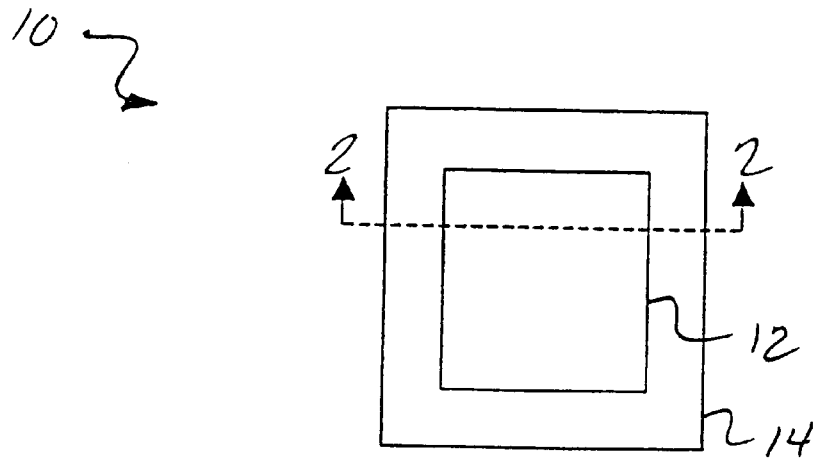
FIG. 1 is a top plan view of a first embodiment of a fluid control valve assembly according to this invention.

A first embodiment of a fluid control valve assembly for controlling fluid flow in a high-pressure fluid circuit is shown generally at 10 in FIG. 1. Examples of high-pressure fluid circuits in which the fluid control valve assembly 10 may be used include a vehicle brake circuit requiring pressures in excess of 200 bar, and a vehicle transmission system requiring fluid pressures exceeding 20 bar. The valve assembly 10 includes a microvalve device 12 of any suitable type. Examples of suitable microvalve devices include any one of the microvalve devices described in U.S. patent application Ser. No. 08/865,466, filed May 29, 1997, incorporated herein by reference, and U.S. patent application Ser. No. 09/148,024, filed Sep. 3, 1998, incorporated herein by reference. The microvalve device 12 has, like any valve, internal flow passages (not shown) for admitting and discharging fluid flow through the valve. The microvalve device 12 is attached to a fluid distributing substrate or manifold 14 to form a pair of high-pressure fluid connections between the microvalve device 12 and the fluid distributing substrate 14. The microvalve may have a suitably metallized surface to allow a metallic bonding, such as solder, between the microvalve device 12 and the substrate 14.

Figure 2:
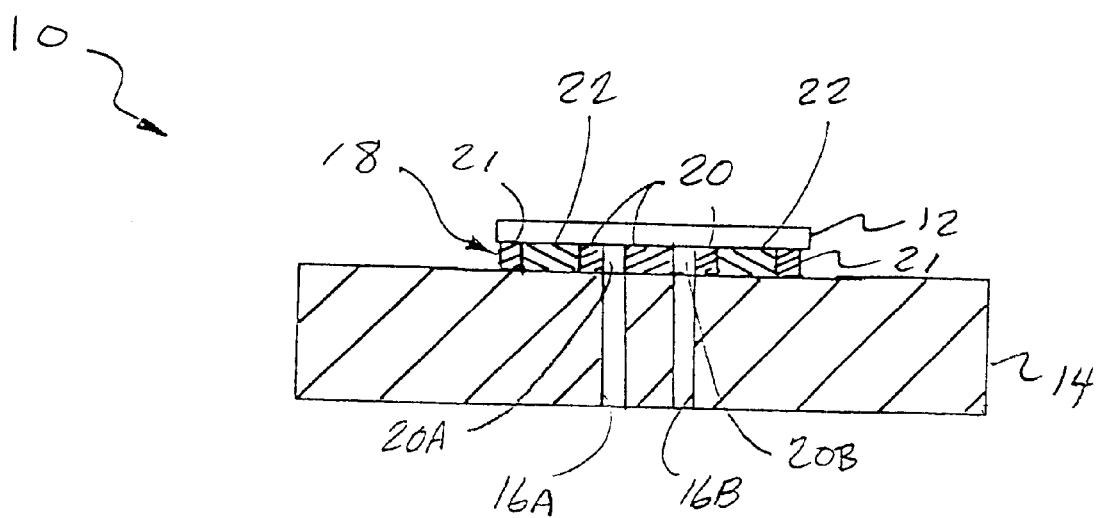
FIG. 2 is an enlarged view of the control valve assembly and fluid source taken along a line 2—2 of FIG. 1, shown partly in section.

Referring to FIGS. 1 and 2, the fluid distributing substrate 14 is shown as a flat, four-sided member. Alternatively, the fluid distributing substrate 14 may be any suitable shape. The fluid distributing substrate 14 may be any suitable material such as metals, ceramics, metal matrix composites, and the like. Examples of metallic materials believed to be especially suitable for some applications include iron-nickel alloys, carbon-nickel alloys, nickel-iron alloys, aluminum alloys and the like. In particular, it may be advantageous that the fluid distributing substrate 14 be made of material having a low rate of thermal expansion that remains generally constant throughout the working temperature range of the valve assembly 10. An example of such a material is Carpenter Low Expansion "42"® (K94101) manufactured by Carpenter Steel Division of Carpenter Technology Corporation, Reading, Pennsylvania. Carpenter Low Expansion "42" is a nickel-iron alloy consisting of about 0.05% carbon, 0.4% manganese, 0.2% silicon, 41% nickel, and the remaining balance iron. Other materials believed to be suitable include KOVAR® (alloy containing about 54% iron, about 28% nickel and about 18% cobalt), aluminum nitride, and metal matrix composites such as Al/SiC or Cu/C (graphite).

FIG. 2 shows the fluid distributing substrate 14 defining a pair of fluid passages 16A and 16B. Alternatively, the fluid distributing substrate 14 may be configured so as to define any number of fluid passages. The fluid distributing substrate 14 is adapted such that one end of each of the fluid passages 16A, 16B is connectable in fluid communication with a respective fluid source or medium (not shown). It should be understood that the term "fluid source" as used in this application only means a quantity of fluid. The fluid source may have a relatively high fluid pressure, such as the discharge pressure of a running pump, in which case fluid will tend to flow from that fluid source to the respective fluid passage 16A, 16B. Alternatively, the fluid source may have a relatively low fluid pressure, such as the suction pressure of a running pump, in which case the fluid will tend to flow from the respective fluid passage 16A, 16B to the fluid source.

The valve assembly 10 further includes attachment structure, indicated generally at 18 in FIG. 2. The attachment structure 18 attaches the microvalve device 12 to the fluid distributing substrate 14 such that each of the fluid passages 16A, 16B is sealably connected to a respective port (not shown) of the microvalve device 12. The attachment structure 18 includes a primary solder joint 20 between and attached to the metallized suface(s) of the microvalve device 12 and the fluid distributing substrate 14. The fluid passage 16A is connected in fluid communication with one of the internal passages of the microvalve device 12 through an associated void 20A in the solder joint 20. Similarly, the fluid passage 16B is connected in fluid communication with another of the internal passages of the microvalve device 12 through an associated void 20B in the solder joint 20. The attachment structure 18 also includes secondary solder joints 21 between and attached to the fluid distributing substrate 14 and a predetermined portion or portions of the microvalve device 12. The attachment structure 18 may further include an underfill 22 attached to the microvalve device 12 and the fluid distributing substrate 14 between the primary solder joint 20 and each of the secondary solder joints 21. The material and application processes of the solder joints 20, 21 and the underfill 22 are of suitable types. Examples of suitable materials for the solder joints 20, 21 include a solder alloy of 60% Tin and 40% Lead (60/40 Sn—Pb) or other alloys such s 25/75 Sn—Pb, and the like. Examples of suitable materials for the underfill 22 include epoxies, acrylates, cyanate esters, and the like. It should be understood that in certain applications the primary solder joint 20 and/or the secondary solder joints 21 may be replaced by additional underfill 22. In other applications, the underfill 22 may be omitted entirely.

Furthermore, in certain applications it may be desirous to prevent the flow of electrical current between the microvalve device 12 and the fluid distributing substrate 14 through the solder joints 20, 21. In these applications, one of the microvalve device 12 and the fluid distributing substrate 14 may be formed with a surface coated with a dielectric, such as silicon dioxide between the solder joints 20, 21 and the other one of the microvalve device 12 and the fluid distributing substrate 14.

In operation, the microvalve device 12 selectively allows and restricts fluid flow between the fluid passages 16A and 16B, and thus between the respective fluid sources connected to the fluid passages 16A and 16B. The primary solder joint 20 holds the microvalve device 12 and the fluid distributing substrate 14 to each other while preventing fluid leakage from the fluid passages formed by the voids 20A and 20B. The secondary solder joints 21 assist in holding the microvalve device 12 and the fluid distributing substrate 14 to each other. The underfill 22, in addition to assisting the holding of the microvalve device 12 in place, may also improve the fatigue life of the solder joints 20, 21 by relieving stress attributed to thermal expansion differentials between the microvalve device 12, the solder joints 20, 21 and the fluid distributing substrate 14. Furthermore, the underfill 22 may prevent fluid from escaping the valve assembly 10 should the primary solder joint 20 fracture or otherwise lose structure integrity.

Figure 3:
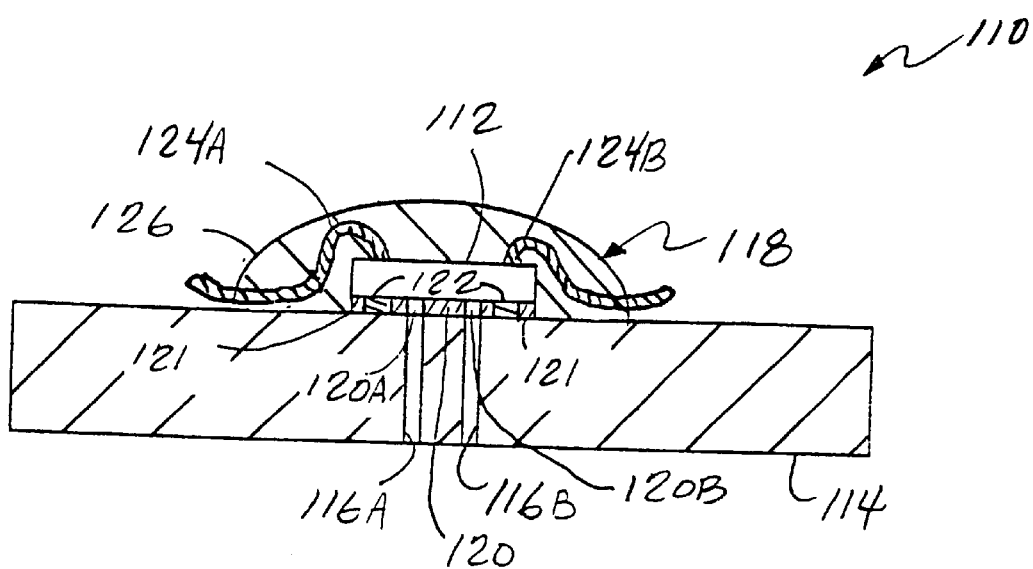
FIG. 3 is a partial sectional view, similar to FIG. 2, of a second embodiment of a fluid control valve assembly according to this invention.

A second embodiment of a fluid control valve assembly is shown generally at 110 in FIG. 3. The valve assembly 110 is similar in structure and in function to the microvalve device 10. Features of the valve assembly 110 corresponding to features of the microvalve device 10 are preceded by a "1". The valve assembly includes a microvalve device 112 sealably connected in fluid communication with a fluid distributing substrate 114 by an attachment structure 118.

A first wirebond 124A and a second wirebond 124B electrically interconnect the microvalve device 112 and an electrical power supply (not shown). The wirebonds 124A, 124B provide electrical current supplied from the electrical power supply to the microvalve device 112 for actuating the microvalve device. Preferably, the wirebonds 124A, 124B are directly connected to the electrical power supply to complete an electrical circuit. Alternatively, the wirebonds 124A and 124B may be electrically connected to separate conductive plates or films (not shown), which are supported by the fluid distributing substrate 114. Provided that the fluid distributing substrate 114 is made of an electrically conductive material, the conductive plates or films are suitably electrically insulated from the fluid distributing substrate 114. When the wirebonds 124A, 124B are attached to the conductive plates or films, the electrical power supply is also electrically connected to each of the conductive plates or films by wiring or the like to complete an electrical circuit.

The attachment structure 118 includes an encapsulant 126 or glob top encasing each surface of the microvalve device 112 which would otherwise be left exposed having properly positioned the microvalve device 112 to the fluid distributing substrate 114. Additionally, the encapsulant 126 may preferably be attached to a portion of the fluid distributing substrate 114. Indeed, as shown in FIG. 3, the encapsulant 126 covers all the faces of the microvalve device 112 that are not soldered to the fluid distributing substrate 114, and additionally portions of the fluid distributing substrate 114 around the region soldered to the microvalve device 112. Thus, the encapsulant 126 and the fluid distributing substrate 114 cooperate to completely enclose the microvalve device 112. The encapsulant 126 may be any suitable type including an epoxy, an acrylate, a cyanate ester, and the like.

The encapsulant 126 assists in holding the microvalve device 112 in place by providing an adhesive force that reacts against fluid forces acting on the microvalve device 112 associated with the fluid in the fluid passages 116A and 116B. In certain application, it may be advantageous for the encapsulant 126 to apply a pre-load to the microvalve device 112. This pre-loaded condition may be accomplished by using an encapsulant material having a coefficient of expansion that during a predetermined curing process generates a residual stress acting to exert force on the microvalve device 112. The encapsulant 126 also acts as a secondary seal for preventing fluid from escaping the valve assembly 110. The encapsulant 126 may also improve the fatigue life of the attachment structure 118 as a whole by exerting a force that minimizes stresses caused by thermal expansion differentials between the microvalve device 112 and the fluid distributing substrate 114. In addition, the encapsulant 126 may improve the functioning of the microvalve device 112 by providing a thermal path for dissipating heat associated with the microvalve device 112. Furthermore, the encapsulant 126 provides protection against physical and environmental damage to the valve assembly 110 and to the wirebonds 124A, 124B.

Figure 4:
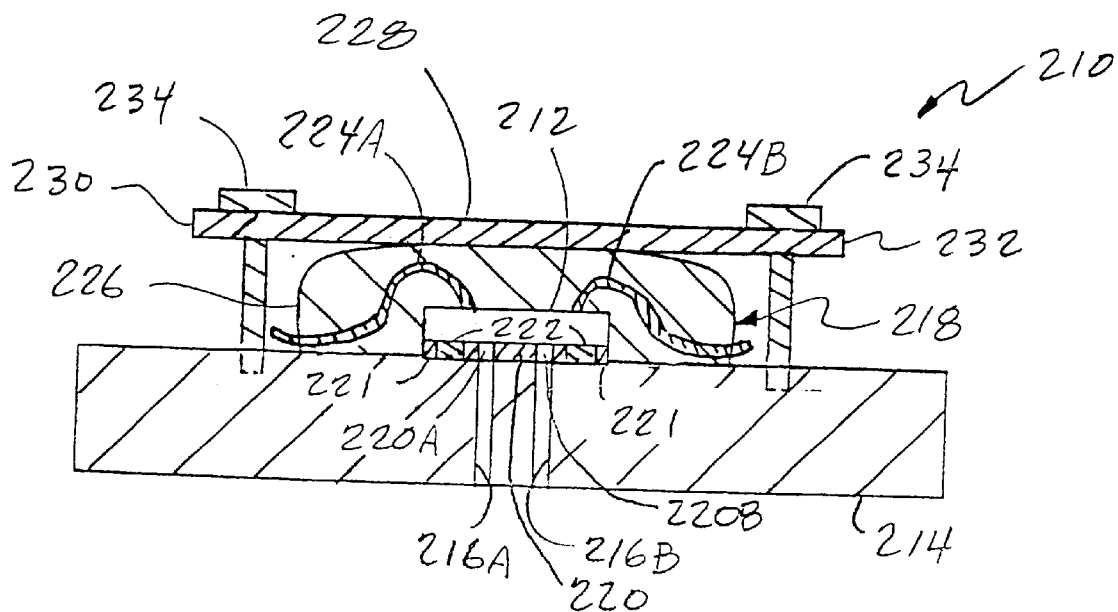
FIG. 4 is a partial sectional view, similar to FIGS. 2 and 3, of a third embodiment of a fluid control valve assembly according to this invention.

A third embodiment of a fluid control valve assembly is shown generally at 210 in FIG. 4. The valve assembly 210 is similar in structure and in function to the microvalve device 110. Features of the valve assembly 210 corresponding to features of the microvalve device 110 are preceded by a "2" in place of a "1". The valve assembly 210 includes a microvalve device 212 sealably connected in fluid communication with a fluid distributing substrate 214 by an attachment structure 218.

The attachment structure 218 includes an encapsulant 226 that encases the microvalve device 212 and is preferably attached to the fluid distributing substrate 214. It should be understood that while it is preferable for the encapsulant 226 to attach to the fluid distributing substrate 214, it may be suitable for the encapsulant 226 to simply contact the fluid distributing substrate 214 or to not even contact the fluid distributing substrate 214.

The attachment structure further includes a cap 228 contacting a portion of an otherwise exposed surface of the encapsulant 226 that is opposite the surface of the microvalve device 112 attached to the fluid distributing substrate 114. Preferably, the cap 228 is a flat, four-sided plate. Alternatively, the cap 228 may be of and suitable shape. The cap 228 has comers that preferably overhang beyond the periphery of the encapsulant 226. Apertures are formed in the cap 228 adjacent each corner of the cap 228. A bolt 230 or other suitable fastener extends through each aperture and is fastened to the fluid distributing substrate 214. The bolt 230 has an enlarged head 234 that retains the cap 228 to the bolt 230. Alternatively, the bolts 230 may be replaced by posts (not shown) secured in any suitable fashion, such as by welding, soldering, or by an adhesive, to the cap 228 and to the fluid distributing substrate 214.

The cap 228 assists in holding the microvalve device 212 in place by providing a clamping force acting on the encapsulant 226 that acts against fluid forces transmitted from the microvalve device 212 through the encapsulant 226. It should be understood that the clamping force provided by the cap 228 can be varied for a given application by varying the torque or length of the bolts 230, varying the length of the posts, or by varying the formation of the encapsulant 226. The cap 228 also provides protection against physical damage to the encapsulant 226 and microvalve device 212. Furthermore, the cap 228 may provide a thermal path for dissipating heat associated with the microvalve device 212 and the fluid distributing substrate 214.

Figure 5:
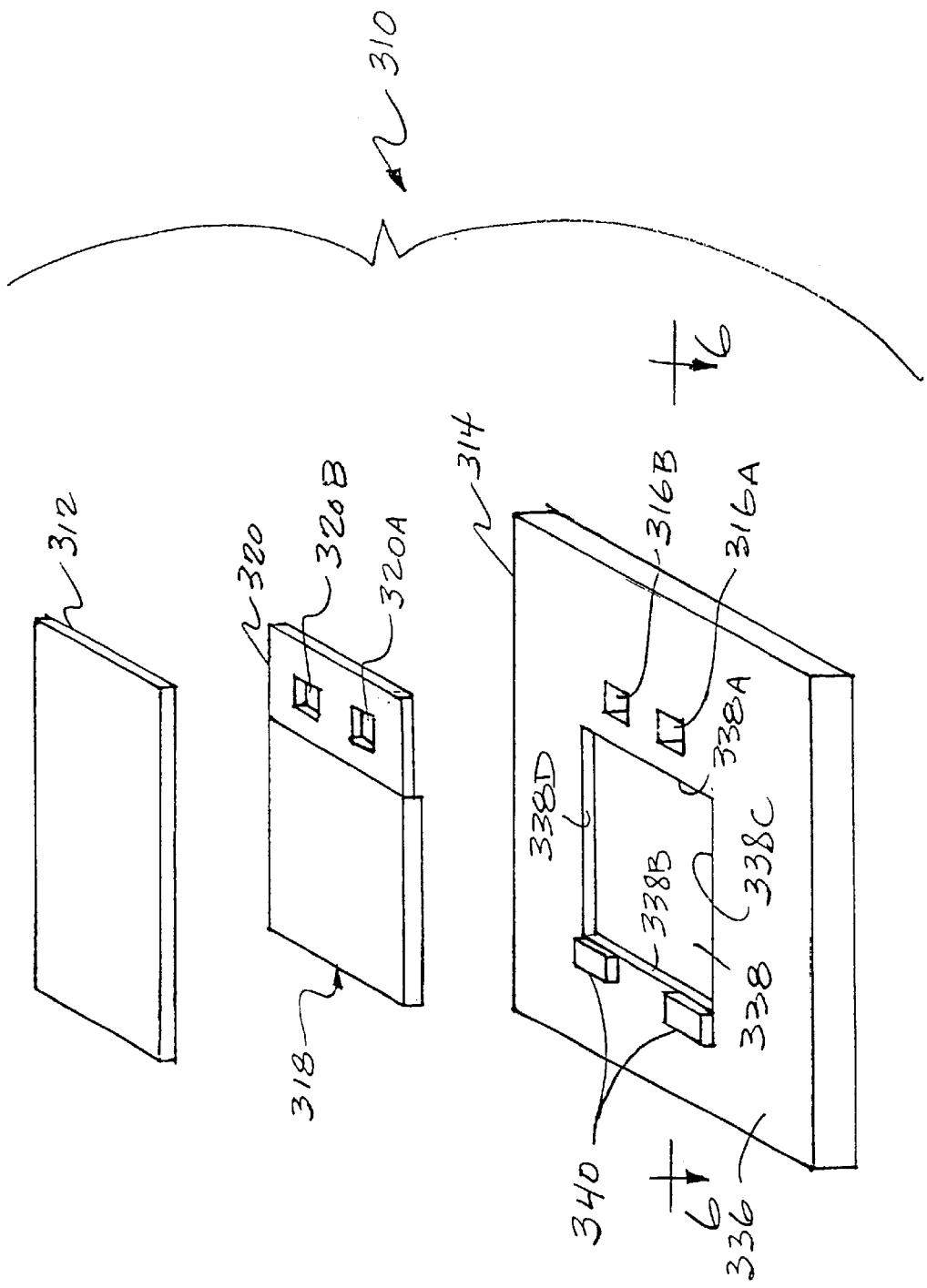
FIG. 5 is an exploded view of a fourth embodiment of a fluid control valve assembly according to this invention.

FIG. 5 is an exploded view of a fourth embodiment of a fluid control valve assembly shown generally at 310. The valve assembly 310 is similar in structure and in function to the microvalve device 10. Features of the valve assembly 310 corresponding to features of the microvalve device 10 are preceded by a "3". The valve assembly 310 includes a microvalve device 312 sealably connected in fluid communication with a fluid distributing substrate 314 by an attachment structure 318.

The fluid distributing substrate 314 defines a pair of fluid passages 316A and 316B extending through the fluid distributing substrate 314 between a first face 336 of the fluid distributing substrate 314 and a second face (not shown) opposite the first face 336. The first face 336 defines a pocket 338 adjacent the fluid passages 316A and 316B. The pocket 338 may be of any suitable shape, but is shown having four sides: a first side 338A adjacent the fluid passages 316A and 316B, a second side 338B opposing the first side 338A, a third side 338C extending between the first side 338A and the second side 338B, and fourth 338D opposing the third side 338C. Resting pads 340 extend from the first face 336 adjacent the second side 338B. Alternatively, any number of resting pads 340 may be located about any or all of the sides 338A–338D, which will be made clearer in view of the purpose of the resting pads 340 discussed below.

Figure 6:
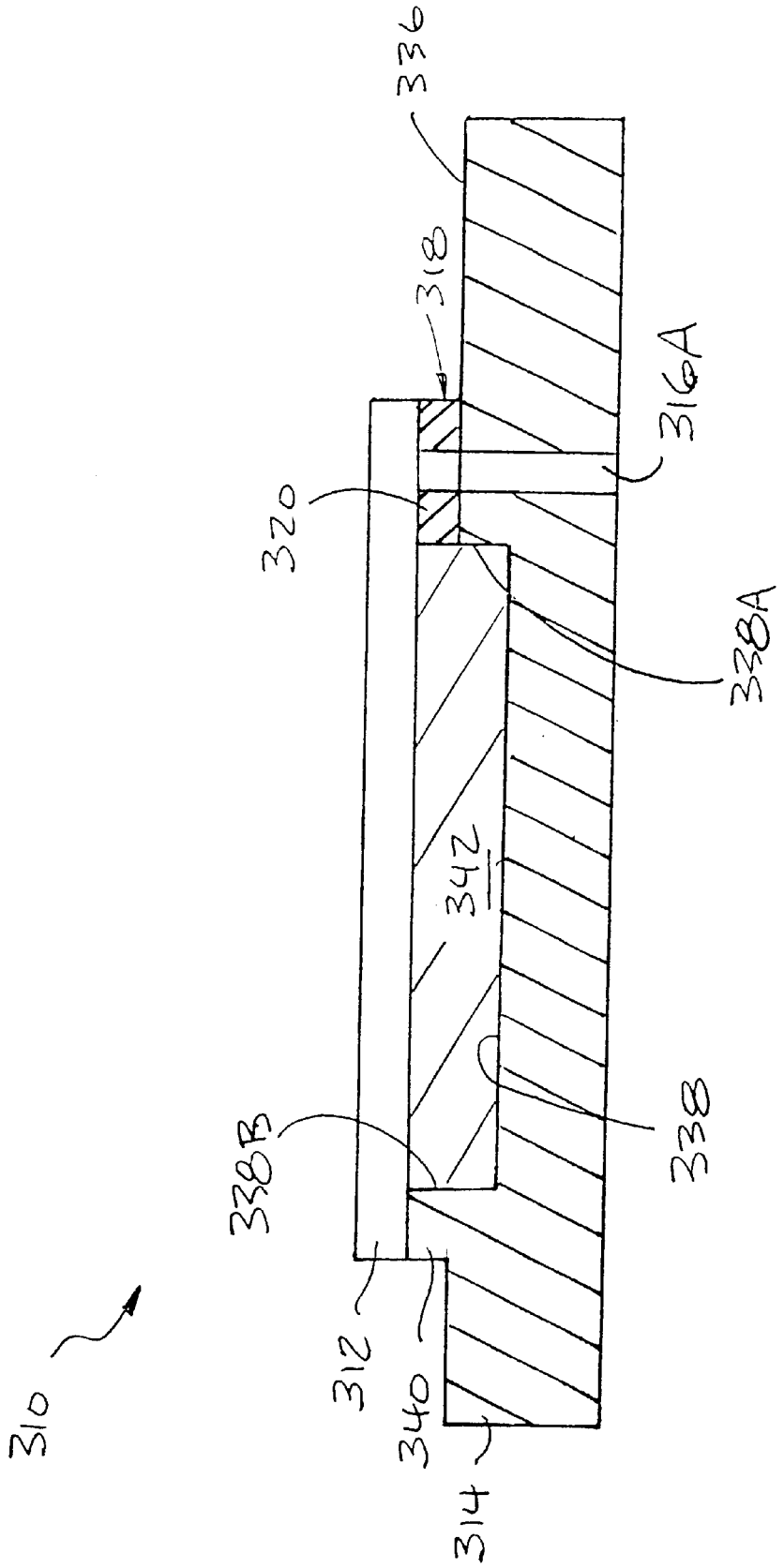
FIG. 6 is an enlarged sectional view of FIG. 5 taken along a line 6—6 of FIG. 5.

The attachment structure 318 includes a solder joint 320 between and attached to the microvalve device 312 and the fluid distributing substrate 314. A pair of voids 320A and 320B are formed in the solder joint 320. The void 320A provides fluid communication between the passage 316A and an associated fluid passage in the microvalve device 312. Similarly, the void 320B provides fluid communication between the passage 316B and an associated fluid passage in the microvalve device 312. The thickness of the solder joint 320 is substantially equal to the height of the resting pads 340. With the microvalve device 312 attached to the fluid distributing substrate 314 by the attachment structure 318, the microvalve device 312 contacts the resting pads 340. As best shown in FIG. 6, the microvalve device 312 is supported in a position substantially perpendicular to the fluid passages 316A, 316B, thereby ensuring that the fluid connection between the microvalve device 312 and the fluid distributing substrate 314 is properly sealed.

The attachment structure 318 further includes an adhesive 342 disposed in the pocket 338 that adheres to the fluid distributing substrate 314 and to the microvalve device 312. Any suitable adhesive may be used. Preferably, the adhesive 342 is an elastomeric adhesive. One adhesive believed to be suitable, in some applications, for use as the adhesive 342 is a silicone adhesive such as the Q3-6611 adhesive manufactured by Dow Corning.

The pocket 338 facilitates the process of applying the adhesive 342. The pocket 338 reduces the likelihood of the adhesive of spilling over in the region of the fluid passages 316A and 316B or elsewhere. However, it should be understood that the pocket 338 may suitably be eliminated in some applications. Additionally, it is believed that the pocket 338 may be formed in the substrate 314 and not have the adhesive 342 disposed therein. Indeed, regardless of whether or not the adhesive 342 is used between the microvalve device 312 and the substrate 314, it may be advantageous to form a pocket in the substrate 312 or the microvalve device 312 in certain areas to prevent contact between a wall of the microvalve device 312 and the substrate 312 in an area of the microvalve device 312 that is succeptable to contact stresses. An example of an area which may be succeptable to contact stresses is the wall surrounding the actuator of certain types of microvalves, where contact stress induced by even careful bonding of a substrate to the microvalve device in the region of the actuator may adversely affect the operation of the actuator and thus the operation of the microvalve.

The adhesive 342 assists in holding the microvalve device 312 in place. In addition, the elastomeric adhesive 342 may provide in some applications a seal for preventing fluid from escaping the valve assembly 310 in the event that the solder joint 320 fails to prevent fluid leakage. The adhesive 342 may also improve the fatigue life of the solder joint 320 by limiting stresses attributed to thermal expansion differentials between the microvalve device 312 and the fluid distributing substrate 314. Furthermore, the adhesive 342 may provide a thermal path for dissipating heat associated with the microvalve device 312. Moreover, an elastomeric adhesive 342 may operate to effectively eliminate or at least reduce the residual stress acting on the microvalve device 312 that might otherwise be generated as a result of the curing process of a relatively inelastic bond formed between the microvalve device 312 and the fluid distributing substrate 314. The avoidance or at least a relative reduction of the presence of residual stress acting on the microvalve device 312 could be instrumental with regards to ensuring the intended functioning of the valve assembly 310. Specifically, in some experimental installations, it has been found that residual stresses developing during the mounting of a microvalve device similar to the microvalve device 312 may distort the housing of the microvalve device and cause relative displacement between various internal elements of the microvalve device, which in turn could cause the microvalve device to function improperly. The use of an elastomeric adhesive 342, as described above, is believed to reduce such residual stresses and minimize or eliminate their impact on the operation of the microvalve device 312.

Figures 7, 8:
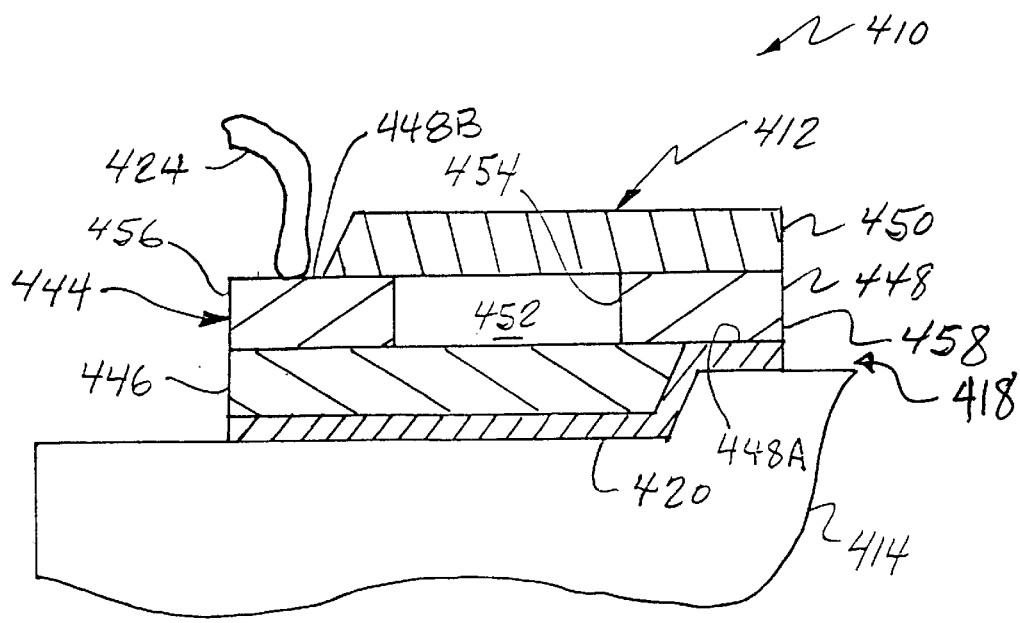
FIG. 7 is a sectional view of a fifth embodiment of a fluid control valve assembly according to this invention.
FIG. 8 is a sectional view of a sixth embodiment of a fluid control valve assembly according to this invention.

A sectional view of a fifth embodiment of a fluid control valve assembly is shown generally at 410 in FIG. 7. The valve assembly 410 is similar in structure and in function to the microvalve device 10. Features of the valve assembly 410 corresponding to features of the microvalve device 10 are preceded by a "4". The valve assembly 410 includes a microvalve device 412 held in fluid communication with a fluid distributing substrate 414 by an attachment structure 418.

The fluid distributing substrate 414 is preferably made of an electrically conductive material and is adapted for connection to a suitable electrical power supply (not shown) for a purpose discussed below.

The microvalve device 412 includes a body indicated generally at 444. The body 444 includes a first plate 446 attached to a second plate 448. A third plate 450 is attached to the second plate 448 so that the second plate 448 is sandwiched between the first plate 446 and the third plate 450. The plates 446, 448 and 450 may have any suitable shape and may be bonded together by any suitable method. In a preferred embodiment, each of the plates 446, 448 and 450 is generally rectangular in plan view. The plates 446, 448, and 450 may be made of any suitable material such as silicon, ceramic, aluminum, or the like. In the illustrated embodiment, each of the plates 446, 448 and 450 is made of a semiconductor material such as silicon. In particular, the first plate 446 and the third plate 450 are made of undoped silicon, while, the second plate 448 is made of doped silicon.

The second plate 448 has a first end 456 (to the left as viewed in FIG. 7) and a second end 458 (to the right as viewed in FIG. 7). The second plate 448 defines a cavity 452 extending through a central portion of the second plate 448. A valve apparatus (not shown) is disposed in the cavity 452.

The valve apparatus may be any microelectromechanical member or subassembly suitable for controlling fluid flow upon being selectively electrically energized or de-energized. The electrically actuated valve apparatus is connected to selected portions of the walls of the cavity 452 formed by the second plate 448. It should be appreciated that the body 444 may be formed from adjoining plates numbering more or less than three. Regarding, these alternative embodiments, the cavity 452 is defined by a cavity or recess formed in one or more of the adjoining plates in which the a valve apparatus is disposed.

The first plate 446 is narrow than the second plate 448 and offset toward the first end 456 of the second plate 448 so that the second end 458 of the second plate 448 overhangs beyond the edge of the first plate 446, as shown in FIG. 7. This leaves a surface 448A of the second plate 448 not in contact with the first plate 446. Similarly, the third plate 450 is narrower than the second plate 448 and offset toward the second end 458 of the second plate 448 to leave a surface 448B of the second plate 448 not in contact with the third plate 450. A wirebond 424, adapted for connection to the electrical power supply, is connected to the surface 448B of the second plate 448.

The attachment structure 418 includes a solder joint 420 extending between and attached to the fluid distributing substrate 414 and the third plate 450. Note that, as in all the embodiments of the invention discussed herein, the surfaces of the substrate 414 and the third plate 450 are preferably metallized by the deposition of a suitable metallic layer (not shown) thereon prior to soldering. The metallic layer may be deposited by any suitable process.

The solder joint 420 also extends between and is attached to the fluid distributing substrate 414 and the surface 448A of the second plate 448. Not illustrated are fluid passages between the fluid distributing substrate 414 and the valve apparatus in the cavity 452. These passages would be similar in nature to fluid passages in the fluid distributing substrates, attachment structure and microvalve devices illustrated in FIGS. 2–6.

In addition to attaching the microvalve device 412 to the fluid distributing substrate 414, the solder joint 420 forms an electrical connection between the doped (electrically conductive) second plate 448 and the fluid distributing substrate 414. As described above, the fluid distributing substrate 414 may also be connected to the electrical power supply. This completes an electrical circuit from the electrical power supply through the wirebond 424 to the doped second plate 448 at the surface 448B, through one wall of the cavity 452 to the electrically actuated valve apparatus disposed in the cavity 452. The return electrical path from the valve apparatus is through another wall of the cavity 452, through the second plate 448 to the surface 448A thereof, through the fluid distributing substrate 414 and back to the power supply. The electrical current is prevented from short-circuiting from the second plate 448 in the region of the surface 448B to the solder joint 420 by the undoped (non-conductive) first plate 446. Unlike the valve assembly 110 that requires two wirebonds 124A and 124B to complete the electrical connection between the microvalve device 112 and the electrical power supply, the valve assembly 410 requires only one wirebond 424 connected to the microvalve device 412 to complete the electrical connection to the electrical power supply. In particular, the solder joint 420 serves the same purpose as a second wirebond. By eliminating the need for a second wirebond connected to the microvalve device 412, the package size of the microvalve device can be reduced, which may result in a less costly valve assembly 410, and one which may be more flexible in placement within the space available for installation of the valve assembly 410.

It should be appreciated, if the first plate 446 and the third plate 450 are made from an electrically conductive material, it is preferable that a suitable dielectric, such as a silicon dioxide layer, be placed between the second plate 448 and each of the first and third plates 446 and 450.

A sectional view of a sixth embodiment of a fluid control valve assembly shown generally 510 in FIG. 8. The valve assembly 510 is similar in structure and in function to the microvalve device 410. Features of the valve assembly 510 corresponding to features of the microvalve device 410 are preceded by a "5" in place of a "4". The valve assembly 510 includes a microvalve device 512 sealably connected in fluid communication with a fluid distributing substrate 514 by an attachment structure 518.

The microvalve device 512 includes a body indicated generally at 544. The body 544 includes a second plate 548 between and attached to a first plate 546 and a third plate 550. Preferably, the first plate 546 and the third plate 550 are made of undoped silicon, while, the second plate 548 is made of doped silicon.

The second plate 548 has a first end 556 (to the left as viewed in FIG. 8) and a second end 558 (to the right as viewed in FIG. 8). The second plate 548 defines a cavity 552 extending through a central portion of the second plate 548. A valve apparatus (not shown) is disposed in the cavity 552. The valve apparatus of the microvalve 512 is similar in structure and in function to the valve apparatus of the microvalve device 412.

An aperture 560 is formed through the first plate 546 adjacent to the second end 558 of the second plate 548. The aperture 560 exposes a surface 548A on the second plate 548. Similarly, an aperture 562 formed through the third plate 550 adjacent to the first end 556 of the second plate 548 exposes a surface 548B on the second plate 548. A wirebond 524, adapted for connection to an electrical power supply, is connected to the surface 548B of the second plate 548 by any suitable method, such as welding, soldering, or the like.

The attachment structure includes a solder joint 520. The solder joint 520 extends into the aperture 560 and bonds with the surface 548A. The solder joint 520 also extends between and bonds with portions of the first plate 546 and the fluid distributing substrate 514. Thus, the solder joint 520 provides a mechanical connection and an electrical connection between the microvalve device 512 and the fluid distributing substrate 514.

In operation, electrical current flows through the valve assembly 510 similar to the electrical current flow through the valve assembly 410.

Figure 9:
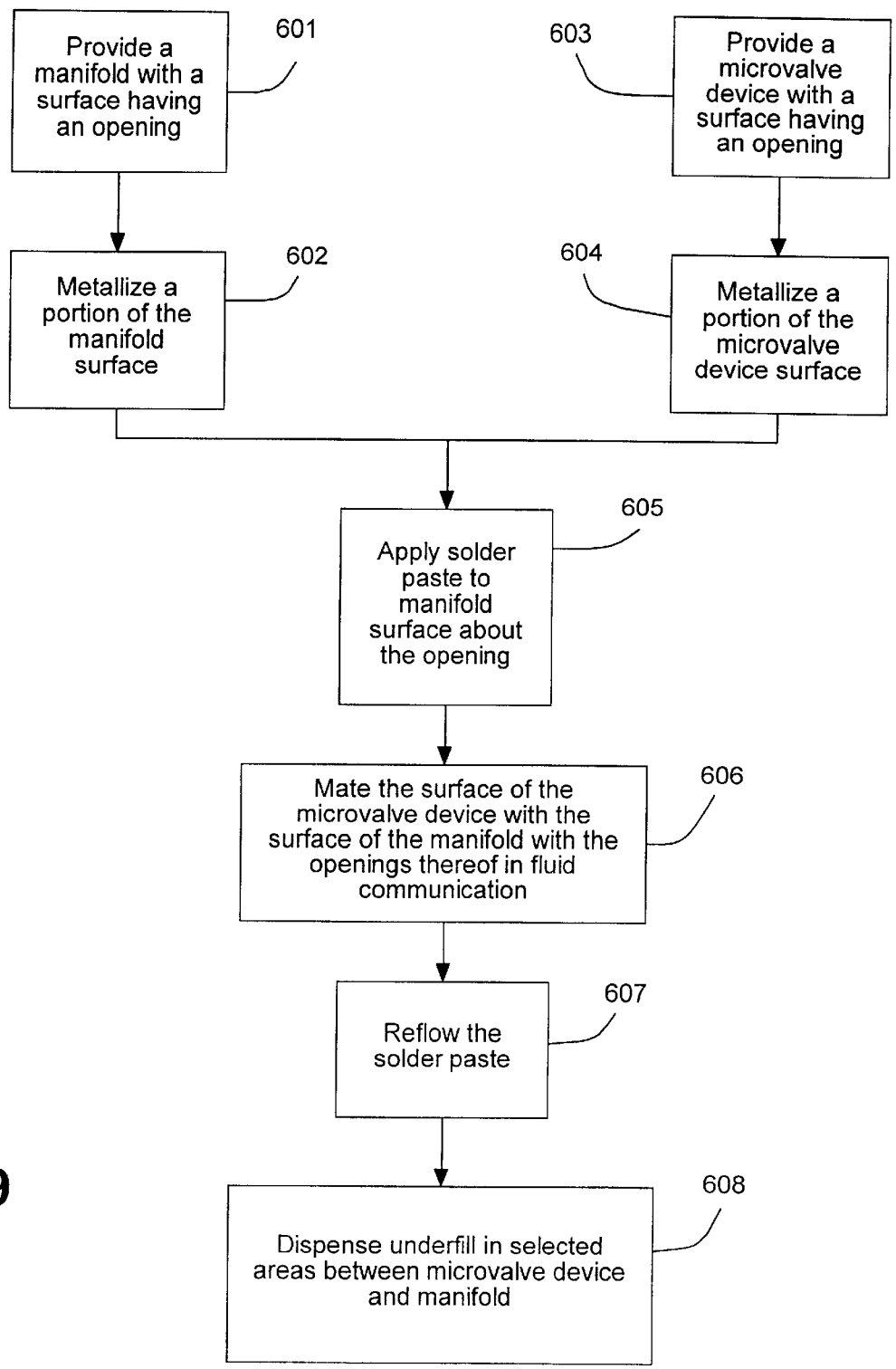
FIG. 9 is a flow chart illustrating a method of attaching a microvalve to a manifold according to the invention.

A general method for attaching a microvalve device to a manifold is illustrated in FIG. 9. In a first step 601, a manifold is provided which defines a surface to be attached to the microvalve device. The manifold has a fluid passage formed therethrough from an opening defined in the surface. Next, in a step 602, at least a portion of the surface of the manifold is metallized through any conventional method, such as plating with copper. For example, in a masking and plating operation, a photo resist may be laminated to the manifold to mask off areas of the manifold which are not to be metallized, followed by plating of the unmasked portions of the surface of the manifold. The photo resist could then be removed by conventional methods. The manifold is preferably metallized in a desired pattern, with the metallization extending on the surface of the manifold about the opening in the surface.

In a step 603, a microvalve device to be attached to the manifold is provided. The microvalve device defines a surface and has an opening defined in the surface thereof. A fluid passage is formed through the microvalve device from the opening in the surface of the microvalve device. In a step 604, at least a portion of the surface of the microvalve device is metallized in any suitable manner, such as the method described above with respect to the manifold, to form a desired pattern on the microvalve device surface. In a preferred embodiment, the surface of the microvalve device is metallized around, but not in, the opening in the surface thereof, and is not metallized adjacent to the actuator portion of the microvalve device. In a step 605, solder is deposited in the desired pattern on the surface of the manifold, with the solder extending about the opening but, preferably, not onto the non-metallized surfaces of the manifold. The solder may be deposited in various ways, including placement of a solder preform, screen printing with a solder paste plating operation, or other suitable fashion. In a step 606, the microvalve device is placed with the surface thereof mating with the surface of the manifold so that the fluid passages of the microvalve device and the manifold are in mutual communication, with the solder contacting the metallized portions of the surface of the microvalve device about the opening in the surface of the microvalve device. In a step 607, the solder is reflowed between the microvalve device and the manifold to form a solder joint joining the microvalve device and the manifold. The solder may be reflowed by any suitable method, such as by heating the microvalve device and the manifold in a reflow oven and subsequently cooling the microvalve device and the manifold. In a preferred embodiment, the solder of the solder joint forms a part of a high-pressure fluid circuit between the microvalve device and the manifold. Suitably, in a step 608, underfill may be dispensed in selected areas between the microvalve device and the manifold. The underfill may, for example, be an epoxy adhesive or other suitable adhesive.

Of course, the order of the steps of this method may be suitably rearranged. For example, the microvalve device might be metallized prior to the manifold being metallized, or the solder applied to the surface of the manifold prior to the provision of the microvalve. It is also contemplated that the solder may be placed on the surface of the microvalve device initially, rather than on the manifold surface.

In accordance with the provisions of the patent statutes, the principle and mode of operation of this invention have been explained and illustrated in its preferred embodiments. However, it must be understood that this invention may be practiced otherwise than as specifically explained and illustrated without departing from its spirit or scope.

What is claimed is:

1. A fluid control valve assembly comprising:

a microvalve device including an actuator and a non-metallized wall portion adjacent said actuator;

a fluid distributing substrate attached to said microvalve device with a high pressure fluid connection between said microvalve device and said fluid distributing substrate, said fluid distributing substrate being adapted for connection in fluid communication with a fluid source; and an attachment structure attaching said microvalve device in fluid communication with said fluid distributing substrate, with said attachment structure forming a fluid conduit between said microvalve device and said fluid distributing substrate, wherein said attachment structure includes a solder joint mechanically joining said microvalve device and said fluid distributing substrate, and wherein said solder joint does not extend onto said non-metallized wall portion adjacent said actuator of said microvalve device.

2. The valve assembly according to claim 1 wherein said attachment structure is disposed between said microvalve device and said fluid distributing substrate.

3. The valve assembly according to claim 2 wherein said attachment structure includes an underfill contacting said microvalve device and said fluid distributing substrate adjacent said solder joint.

4. The valve assembly according to claim 3 wherein said underfill is an epoxy.

5. The valve assembly according to claim 1 wherein said attachment structure includes an elastomeric adhesive disposed between, and adhered to, said microvalve device and said fluid distributing substrate.

6. The valve assembly according to claim 5 wherein said fluid distributing substrate defines a pocket over which a portion of said microvalve device extends.

7. The valve assembly according to claim 6 wherein said elastomeric adhesive is disposed in said pocket.

8. The valve assembly according to claim 1 wherein said attachment structure includes an encapsulant encasing and contacting a portion of said microvalve device and attached to said fluid distributing substrate.

9. A fluid control valve assembly comprising:

a microvalve device;

a fluid distributing substrate attached to said microvalve device with a high-pressure fluid connection between said microvalve device and said fluid distributing substrate, said fluid distributing substrate being adapted for connection in fluid communication with a fluid source; and an attachment structure attaching said microvalve device in fluid communication with said fluid distributing substrate with said attachment structure forming a fluid conduit between said microvalve device and said fluid distributing substrate, said attachment structure including an encapsulant encasing and contacting a portion of said microvalve device and attached to said fluid distributing substrate, said encapsulant being an epoxy adhered to said fluid distributing substrate.

10. The valve assembly according to claim 9 wherein said encapsulant is an epoxy adhered to said fluid distributing substrate.

11. The valve assembly according to claim 10 wherein said attachment structure includes a cap contacting said encapsulant and fastened to said fluid distributing substrate.

12. The microvalve device according to claim 11 wherein said cap is bolted to said fluid distributing substrate.

13. A fluid control valve assembly comprising:

a microvalve device; and a fluid distributing substrate attached to said microvalve device with a high pressure fluid connection between said microvalve device and said fluid distributing substrate, said fluid distributing substrate being adapted for connection in fluid communication with a fluid source, wherein said fluid distributing substrate defines a pocket over which a portion of said microvalve device extends, there being no connection between said portion of said portion of said microvalve device and said pocket of said substrate.

14. A fluid control valve assembly comprising:

a microvalve device including an actuator and a wall portion adjacent said actuator;

a fluid distributing substrate attached to said microvalve device with a high pressure fluid connection between said microvalve device and said fluid distributing substrate, said fluid distributing substrate being adapted for connection in fluid communication with a fluid source; and an attachment structure attaching said microvalve device in fluid communication with said fluid distributing substrate, with said attachment structure forming a fluid conduit between said microvalve device and said fluid distributing substrate, wherein said attachment structure includes a solder joint mechanically joining said microvalve device and said fluid distributing substrate, and wherein said solder joint forms an electrical connection between said microvalve device and said fluid distributing substrate, whereby said fluid distributing substrate, said microvalve device, and said solder joint form part of an electrical circuit.

15. The valve assembly according to claim 14, wherein said microvalve device includes an electrically conductive layer and electrically non-conductive layer disposed between a portion of said electrically conductive layer and said fluid distributing substrate, said solder joint providing an electrical connection between said electrically conductive layer and said fluid distributing substrate.

16. A fluid control valve assembly comprising:

a microvalve device, said microvalve device including an electrically conductive layer and an electrically non-conductive layer;

a fluid distributing substrate attached to said microvalve device with said electrically non-conductive layer of said microvalve device disposed between a portion of said electrically conductive layer and said fluid distributing substrate, said fluid distributing substrate being adapted for connection in fluid communication with a fluid source; and a solder joint mechanically joining said microvalve device and said fluid distributing substrate such that said microvalve device is in fluid communication with said fluid distributing substrate, said solder joint forming a high pressure fluid conduit between said microvalve device and said fluid distributing substrate, said solder joint providing an electrical connection between said electrically conductive layer and said fluid distributing substrate.

17. A fluid control valve assembly comprising:

a microvalve device;

a fluid distributing substrate attached to said microvalve device with a high-pressure fluid connection between said microvalve device and said fluid distributing substrate, said fluid distributing substrate being adapted for connection in fluid communication with a fluid source, and an attachment structure attaching said microvalve device in fluid communication with said fluid distributing substrate with said attachment structure forming a fluid conduit between said microvalve device and said fluid distributing substrate, said attachment structure includes a solder joint mechanically joining said microvalve device and said fluid distributing substrate, said attachment structure being disposed between said microvalve device and said fluid distributing substrate, said attachment structure further including an underfill contacting said microvalve device and said fluid distributing substrate adjacent said solder joint.

18. A fluid control valve assembly comprising:

a microvalve device; and a fluid distributing substrate attached to said microvalve device with a high-pressure fluid connection between said microvalve device and said fluid distributing substrate, said fluid distributing substrate being adapted for connection in fluid communication with a fluid source, said fluid distributing substrate defining a pocket over which a portion of said microvalve device extends; and an attachment structure attaching said microvalve device in fluid communication with said fluid distributing substrate with said attachment structure forming a fluid conduit between said microvalve device and said fluid distributing substrate, said attachment structure including an elastomeric adhesive disposed between, and adhered to, said microvalve device and said fluid distributing substrate, said elastomeric adhesive further being disposed in said pocket.

* * * * *

UNITED STATES PATENT AND TRADEMARK OFFICE
CERTIFICATE OF CORRECTION

PATENT NO. : 6,505,811 B1
DATED : January 14, 2003
INVENTOR(S) : Richard J. Barron et al.

It is certified that error appears in the above-identified patent and that said Letters Patent is hereby corrected as shown below:

<u>Column 12,</u>
Line 1, delete "of said portion".
Line 29, after "and" insert -- an --.

Signed and Sealed this

Seventeenth Day of June, 2003

JAMES E. ROGAN
*Director of the United States Patent and Trademark Office*